(12) United States Patent
Violette

(10) Patent No.: US 7,332,408 B2
(45) Date of Patent: Feb. 19, 2008

(54) ISOLATION TRENCHES FOR MEMORY DEVICES

(75) Inventor: Michael Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 332 days.

(21) Appl. No.: 10/878,805

(22) Filed: Jun. 28, 2004

(65) Prior Publication Data

US 2005/0285179 A1    Dec. 29, 2005

(51) Int. Cl.
H01L 21/76    (2006.01)

(52) U.S. Cl. .............. 438/435; 438/201; 438/357; 438/258; 438/259; 438/260; 438/261; 438/262; 438/263; 438/264; 438/265; 438/266; 438/267

(58) Field of Classification Search ........... 438/201, 438/435, 257–267, 314, 315, 316, 317, 318, 438/319, 320; 257/E21.68, 314–320
See application file for complete search history.

(56) References Cited

U.S. PATENT DOCUMENTS

| | | | |
|---|---|---|---|
| 6,566,229 B2 | 5/2003 | Hong | |
| 6,693,050 B1 | 2/2004 | Cui | |
| 6,756,654 B2 * | 6/2004 | Heo et al. | 257/510 |
| 7,033,909 B2 * | 4/2006 | Kim et al. | 438/435 |
| 2002/0072198 A1 | 6/2002 | Ahn | |
| 2002/0127817 A1 | 9/2002 | Heo et al. | |
| 2003/0006476 A1 | 1/2003 | Chen et al. | |
| 2003/0013271 A1 | 1/2003 | Knorr et al. | |
| 2003/0143852 A1 | 7/2003 | En-Ho et al. | |
| 2004/0192009 A1 * | 9/2004 | Belyansky et al. | 438/424 |
| 2005/0287731 A1 * | 12/2005 | Bian et al. | 438/201 |

OTHER PUBLICATIONS

S.H. Shin, et al., "Data Retention Time and Electrical Characteristics of Cell Transfer According to STI Materials in 90 nm DRAM," Journal of Semiconductor Technology and Science, vol. 3, No. 2, Jun. 2003, pp. 69-75.

* cited by examiner

Primary Examiner—Lynne Gurley
Assistant Examiner—Samuel A Gebremariam
(74) Attorney, Agent, or Firm—Leffert, Jay & Polglaze P.A.

(57) ABSTRACT

Methods and apparatus are provided. A first dielectric plug is formed in a portion of a trench that extends into a substrate of a memory device so that an upper surface of the first dielectric plug is recessed below an upper surface of the substrate. The first dielectric plug has a layer of a first dielectric material and a layer of a second dielectric material formed on the layer of the first dielectric material. A second dielectric plug of a third dielectric material is formed on the upper surface of the first dielectric plug.

54 Claims, 5 Drawing Sheets

ISOLATION TRENCHES FOR MEMORY DEVICES

TECHNICAL FIELD OF THE INVENTION

The present invention relates generally to memory devices and in particular the present invention relates to isolation trenches for memory devices.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

Memory devices are typically formed on semiconductor substrates using semiconductor fabrication methods. The array of memory cells is disposed on the substrate. Isolation trenches formed in the substrate within the array and filled with a dielectric, e.g., shallow trench isolation (STI), provide voltage isolation on the memory array by acting to prevent extraneous current flow through the substrate between the memory cells. The isolation trenches are often filled using a physical deposition process, e.g., with high-density plasma (HDP) oxides. However, the spacing requirements for flash memory arrays often require the isolation trenches to have relatively narrow widths, resulting in large aspect (or trench-depth-to-trench-width) ratios. The large aspect ratios often cause voids to form within the dielectric while filling these trenches using physical sputtering processes.

Filling the trenches with spin-on-dielectrics (SODs) can reduce the formation of voids within the dielectric during filling. However, spin-on-dielectrics usually have to be cured (or annealed) after they are disposed within the trenches, e.g., using a steam-oxidation process that can result in unwanted oxidation of the substrate and of layers of the memory cells overlying the substrate. To protect against such oxidation, the trenches can be lined with a nitride liner prior to filling the trenches with a spin-on-dielectric. One problem with nitride liners is that they can store trapped charges that can adversely affect the reliability of the memory cells and thus the memory device.

For the reasons stated above, and for other reasons stated below which will become apparent to those skilled in the art upon reading and understanding the present specification, there is a need in the art for alternatives to existing trench-fill methods.

SUMMARY

The above-mentioned problems with filling isolation trenches and other problems are addressed by the present invention and will be understood by reading and studying the following specification.

For one embodiment, the invention provides a method of forming a portion of a memory device. The method includes forming a first dielectric plug in a portion of a trench that extends into a substrate so that an upper surface of the first dielectric plug is recessed below an upper surface of the substrate. The first dielectric plug has a layer of a first dielectric material and a layer of a second dielectric material formed on the layer of the first dielectric material. Forming a second dielectric plug of a third dielectric material on the upper surface of the first dielectric plug is included in the method.

For another embodiment, the invention provides a method of forming a portion of a memory device. The method includes lining a portion of a trench that extends into a substrate with a first dielectric layer by forming the first dielectric layer on the substrate and forming a second dielectric layer on the first dielectric layer. The method includes forming a third dielectric layer on the second dielectric layer so that the third dielectric layer fills a portion of the trench and so that an upper surface of the third dielectric layer is located below an upper surface of the substrate. Removing a portion of the second dielectric layer to a level of the upper surface of the third dielectric layer to expose a portion of the first dielectric layer located between the upper surface of the third dielectric layer and the upper surface of the substrate is included in the method, as is forming a fourth dielectric layer within the trench so as to fill a remaining portion of the trench. A portion of the fourth dielectric layer is formed on the upper surface of the third dielectric layer and on the exposed portion of the first dielectric layer.

For another embodiment, the invention provides a memory device that has a trench that extends into a substrate. A first dielectric plug is disposed in the trench so that an upper surface of the first dielectric plug is located below an upper surface of the substrate. The first dielectric plug has a layer of a first dielectric material and a layer of a second dielectric material formed on the layer of the first dielectric material. A second dielectric plug of a third dielectric material is disposed in the trench on the upper surface of the first dielectric plug.

Further embodiments of the invention include methods and apparatus of varying scope.

DETAILED DESCRIPTION

Figure 1:
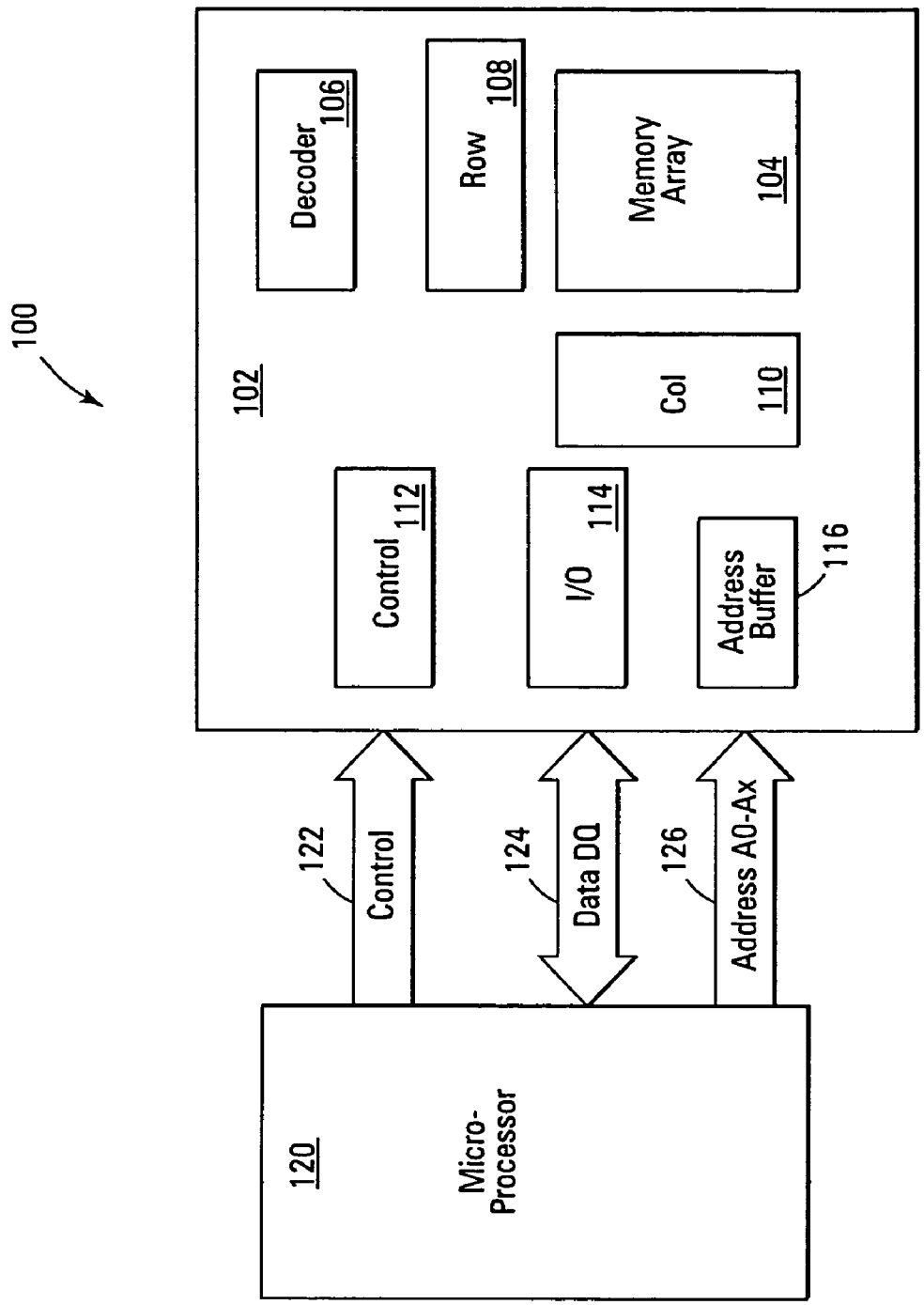
FIG. 1 is a simplified block diagram of a memory system, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 is a simplified block diagram of a memory system 100, according to an embodiment of the invention. Memory system 100 includes an integrated circuit memory device 102, such as a flash memory device, e.g., a NAND or NOR memory device, a DRAM, an SDRAM, etc., that includes an array of memory cells 104 and a region peripheral to memory array 104 that includes an address decoder 106, row access circuitry 108, column access circuitry 110, control circuitry 112, Input/Output (I/O) circuitry 114, and an address buffer 116. The row access circuitry 108 and column access circuitry 110 may include high-voltage circuitry, such as high-voltage pumps. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

The memory array 104 includes memory cells arranged in row and column fashion. For one embodiment, the memory cells are flash memory cells that include a floating-gate field-effect transistor capable of holding a charge. The cells may be grouped into blocks. Each of the cells within a block can be electrically programmed on an individual basis by charging the floating gate. The charge can be removed from the floating gate by a block erase operation.

For one embodiment, memory array 104 is a NOR flash memory array. A control gate of each memory cell of a row of the array is connected to a word line, and a drain region of each memory cell of a column of the array is connected to a bit line. The memory array for NOR flash memory devices is accessed by row access circuitry, such as the row access circuitry 108 of memory device 102, activating a row of floating gate memory cells by selecting the word line connected to their control gates. The row of selected memory cells then place their data values on the column bit lines by flowing a differing current, depending upon their programmed states, from a connected source line to the connected column bit lines.

For another embodiment, memory array 104 is a NAND flash memory array also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by row access circuitry, such as the row access circuitry 108 of memory device 102, activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

Figure 2A:
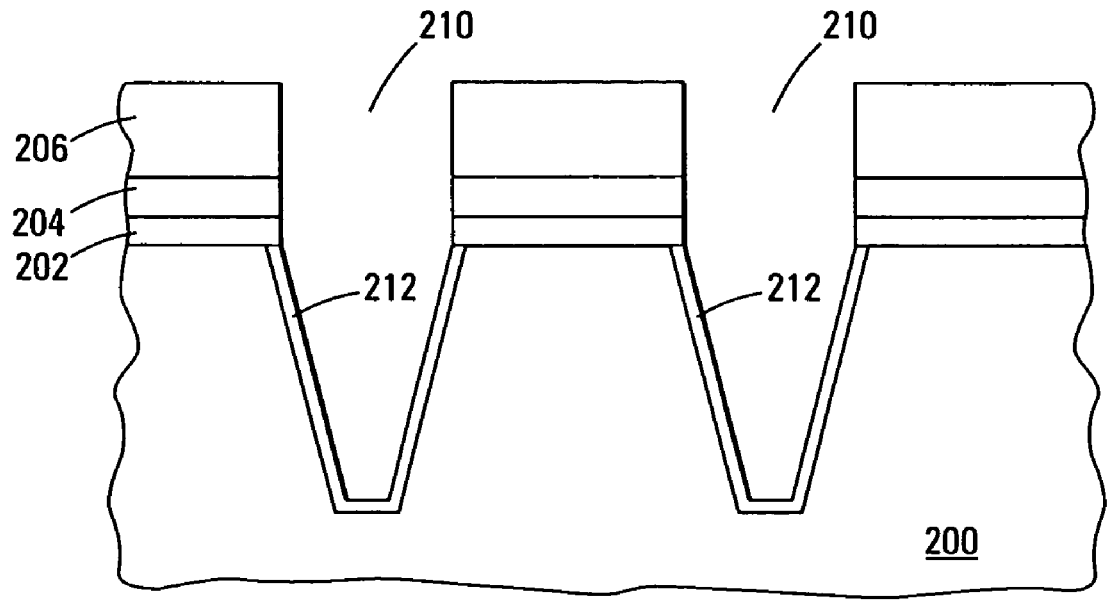
FIGS. 2A-2H are cross-sectional views of a portion of a memory device during various stages of fabrication, according to another embodiment of the invention.

FIGS. 2A-2H are cross-sectional views of a portion of a memory device, such as a portion of the memory device 102, during various stages of fabrication, according to another embodiment of the invention. FIG. 2A depicts the portion of the memory device after several processing steps have occurred. Formation of the structure depicted in FIG. 2A is well known and will not be detailed herein.

In general, the structure of FIG. 2A is formed by forming a first dielectric layer 202 on a substrate 200, e.g., of silicon or the like. For one embodiment, the first dielectric layer 202 is a gate dielectric layer (or tunnel dielectric layer), such as a tunnel oxide layer. A conductive layer 204, e.g., a layer of doped polysilicon, is formed on the first dielectric layer 202, and a hard mask layer 206 is formed on the conductive layer 204. The mask layer 206 can be a second dielectric layer, such as a nitride layer, e.g., a silicon nitride ($Si_3N_4$) layer.

Trenches 210 are subsequently formed through the mask layer 206, the conductive layer 204, and the first dielectric layer 202 and extend into substrate 200. This can be accomplished by patterning the mask layer 206 and etching. A third dielectric layer 212 may then be formed on portions of the substrate 200 exposed by the trenches 210 so as to line the portion of trenches 210 formed in substrate 200.

Figure 2B:
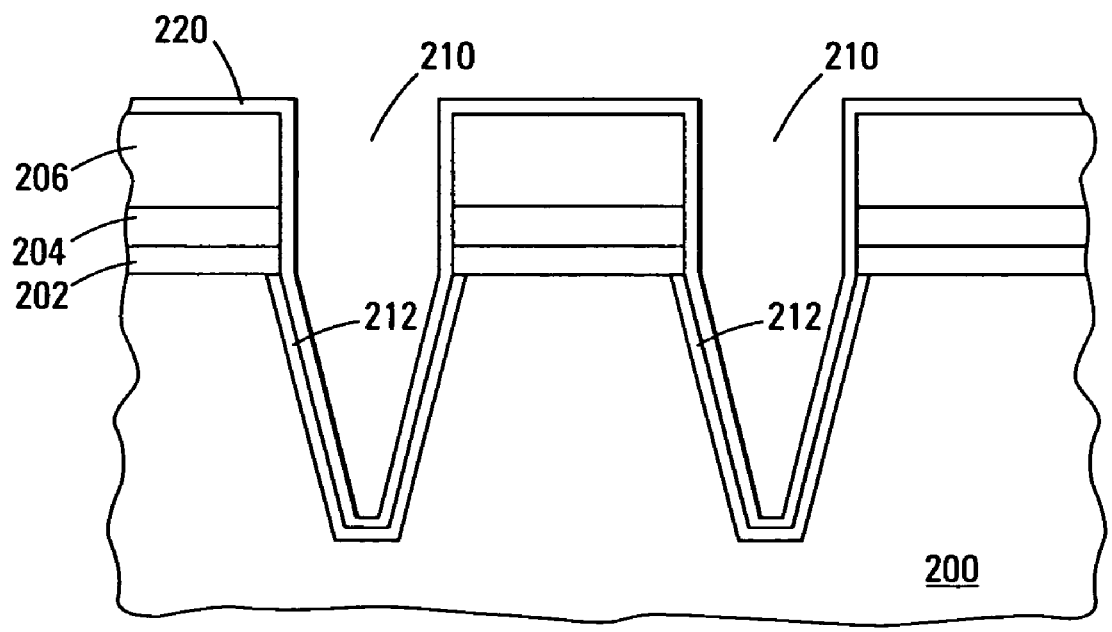

A fourth dielectric layer 220, such as a nitride layer, e.g., a silicon nitride layer, is formed on the structure of FIG. 2A in FIG. 2B, such as by blanket deposition, and acts as an oxidation barrier layer for one embodiment. Specifically, the fourth dielectric layer 220 is formed on an upper surface of mask layer 206 and on portions of the mask layer 206, the conductive layer 204, and the first dielectric layer 202 through which trenches 210 pass. The fourth dielectric layer 220 is also formed on the third dielectric layer 212. In this way, the fourth dielectric layer 220 lines trenches 210. For one embodiment, the third dielectric layer 212 acts to provide adhesion between substrate 200 and the fourth dielectric layer 220 and acts as a stress release layer for relieving stresses that would otherwise form between substrate 200 and the fourth dielectric layer 220. For another embodiment, the third dielectric layer 212 is a pad oxide layer and can be a thermal oxide layer. For another embodiment, the third dielectric layer 212 is, for example, of deposited silicon dioxide ($SiO_2$).

Figure 2C:
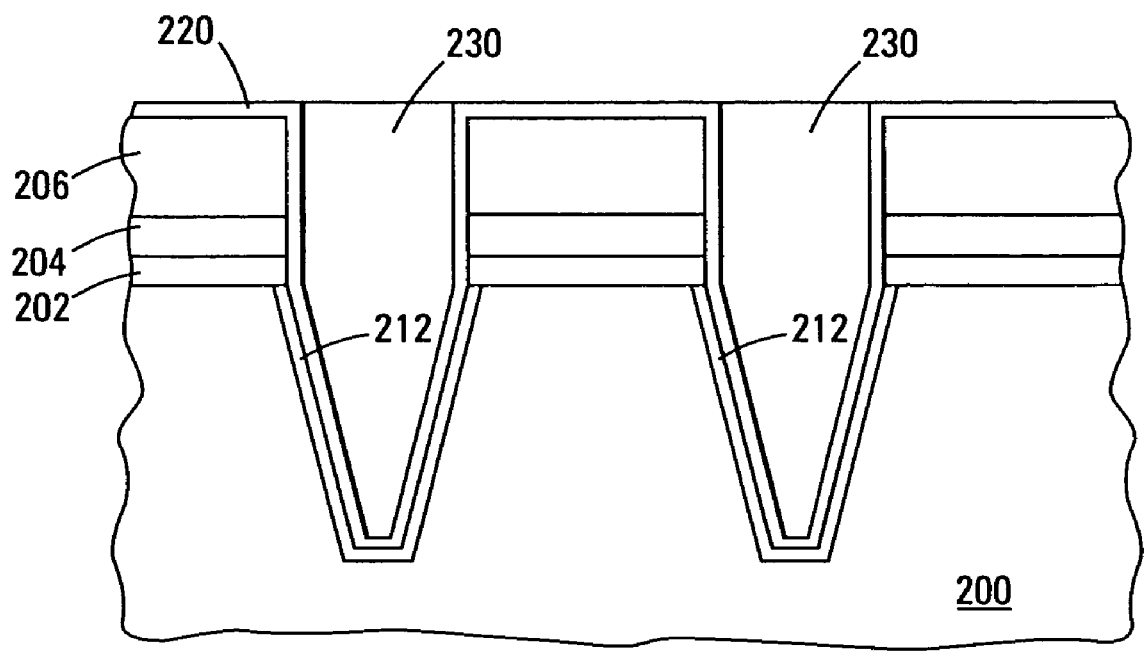
Figure 2D:
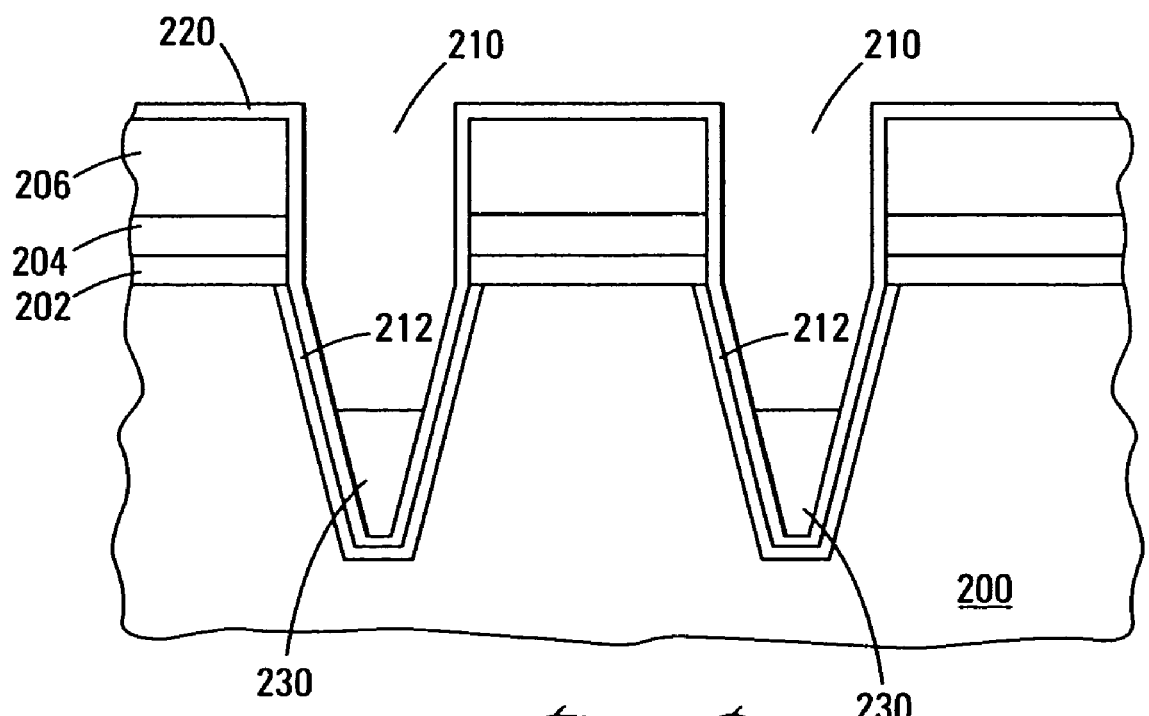

A fifth dielectric layer 230 is deposited within each of the trenches 210 on the fourth dielectric layer 220 in FIG. 2C to either fill or partially fill trenches 210. For one embodiment, the fifth dielectric layer 230 is spin-on dielectric (SOD) material 230, such as a spin-on glass, hydrogen silsesquioxane (HSQ), hexamethyldisiloxane, octamethyltrisiloxane, etc. The fifth dielectric layer 230 is then cured (or annealed), e.g., using a steam-oxidation process, if necessary. For one embodiment, the fourth dielectric layer 220 acts to prevent oxidation of the substrate 200 and the conductive layer 204 during curing. In FIG. 2D, a portion of the fifth dielectric layer 230 is removed, such as by etching in an etch-back process, so that an upper surface of the fifth dielectric layer 230 is recessed within the respective trenches 210, e.g., below an upper surface of substrate 200, exposing a portion of the fourth dielectric layer 220 lining each of trenches 210.

Figure 2E:
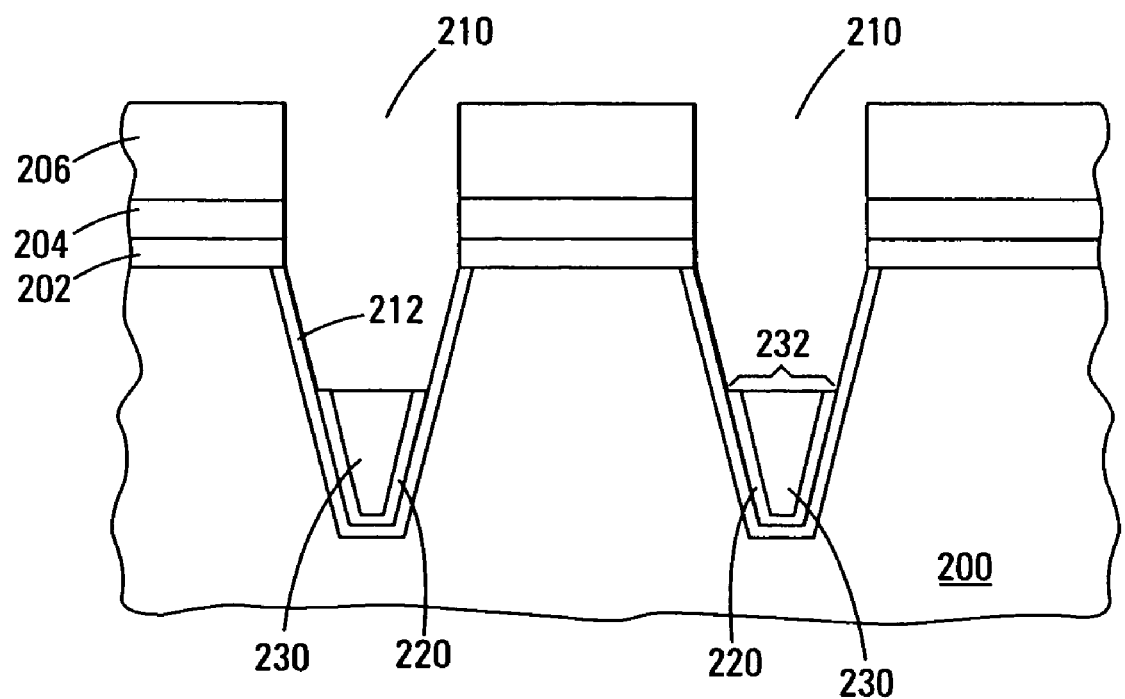

A portion of the fourth dielectric layer 220 is selectively removed in FIG. 2E, e.g., using a controlled wet etch, to a level of the upper surface of the fifth dielectric layer 230 such that a remaining portion of the fourth dielectric layer 220 is interposed between the fifth dielectric layer 230 and the third dielectric layer 212. That is, the fourth dielectric layer 220 is removed from an upper surface of the mask layer 206, and the exposed portion of the fourth dielectric layer 220 located within each of trenches 210 is removed. This exposes the upper surface of the mask layer 206, the portions of the mask layer 206, the conductive layer 204, and the first dielectric layer 202 through which trenches 210 pass, and a portion of the third dielectric layer 212 lying between the upper surface of substrate 200 and the upper surface of the fifth dielectric layer. The remaining portions of the fourth dielectric layer 220 and the fifth dielectric layer 230 form a first dielectric plug 232 that fills a lower portion of trenches 210, as shown in FIG. 2E, having an upper surface that is recessed below the upper surface of the substrate 200.

Figure 2F:
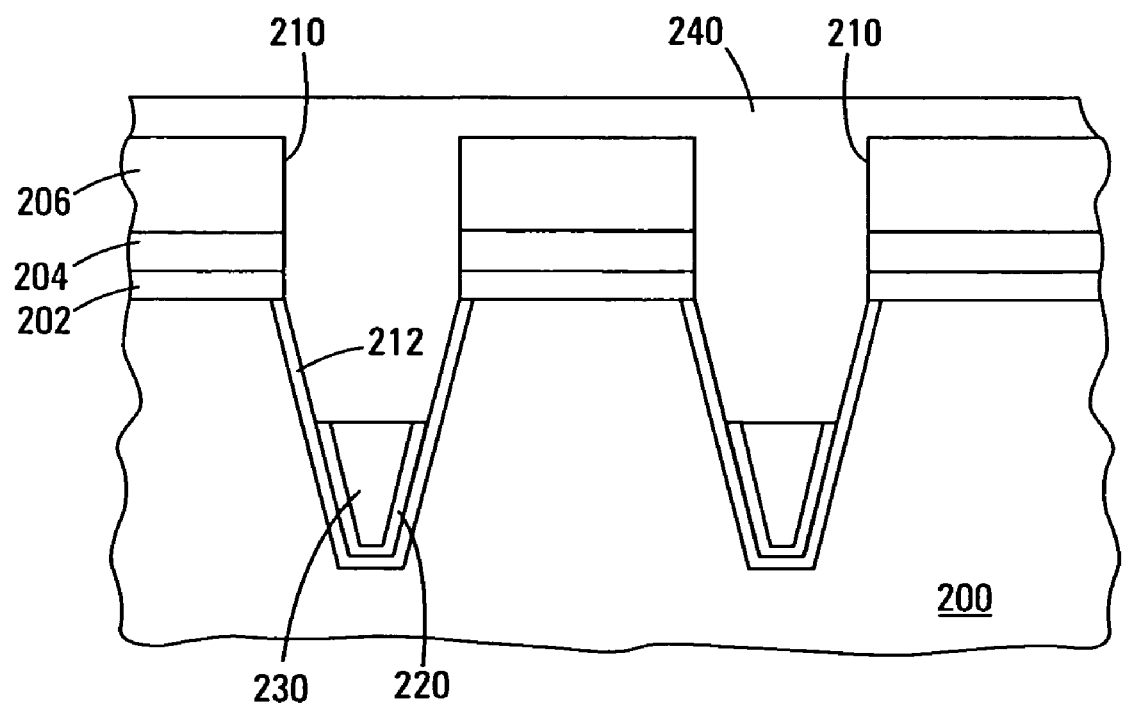

In FIG. 2F, a sixth dielectric layer 240 is blanket deposited, e.g., using a physical sputtering process, over the structure of FIG. 2E and fills an unfilled portion of each of trenches 210. Specifically, the sixth dielectric layer 240 is deposited on the exposed upper surface of the mask layer 206, on the exposed portions of the mask layer 206, the conductive layer 204, and the first dielectric layer 202 through which trenches 210 pass, on the portion of the third dielectric layer 212 lying between the upper surface of substrate 200 and the upper surface of the fifth dielectric layer, and on the first dielectric plug 232. For one embodiment, the sixth dielectric layer 240 is of a high-density-plasma (HDP) dielectric material, such as a high-density-plasma (HDP) oxide. Note that the first dielectric plugs 232 reduce the remaining depths of trenches 210 and thus their aspect ratios for the deposition of the sixth dielectric layer 240. The reduced aspect ratios of trenches 210 act to reduce the formation of voids when depositing the sixth dielectric layer 240 within the unfilled portions of trenches 210.

Figure 2G:
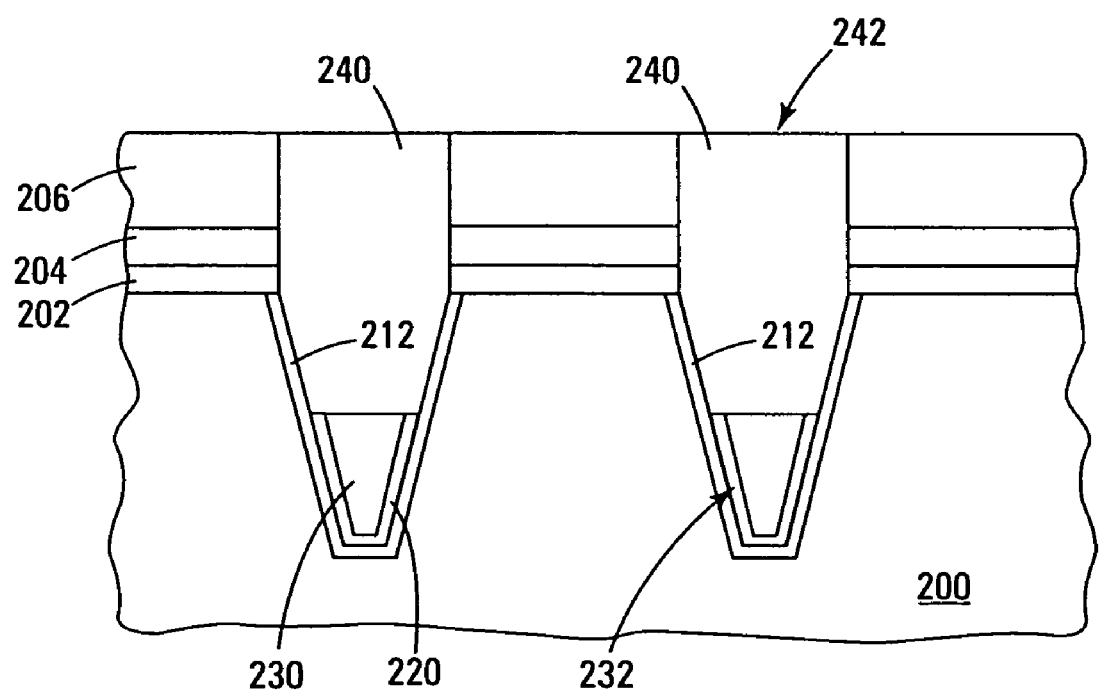

A portion of the sixth dielectric layer 240 is removed from the structure of FIG. 2F in FIG. 2G, e.g., using chemical mechanical polishing (CMP). That is, the sixth dielectric layer 240 is removed so that the upper surface of the mask layer 206 is exposed and so that an upper surface of the sixth dielectric layer 240 within each of trenches 210 is substantially flush with the upper surface of the mask layer 206. Note that the portion of the sixth dielectric layer 240 within each of the trenches 210 forms a second dielectric plug 242 that passes through the mask layer 206, the conductive layer 204, and the first dielectric layer 202, extends into the substrate 200, and terminates at the first conductive plug 232. The third dielectric layer 212 is interposed between the portion of the second dielectric plug 242 and the substrate 200 and the first dielectric plug 232 and the substrate 200.

Note that the fourth dielectric layer 220 is located in the lower portion of each of trenches 210 and thus away from the layers disposed on the upper surface of substrate 200 that can be used to form memory cells. This acts to reduce problems associated with the fourth dielectric layer 220 storing trapped charges, especially when the fourth dielectric layer 220 is of nitride, that can adversely affect the reliability of the memory cells and thus the memory device.

Figure 2H:
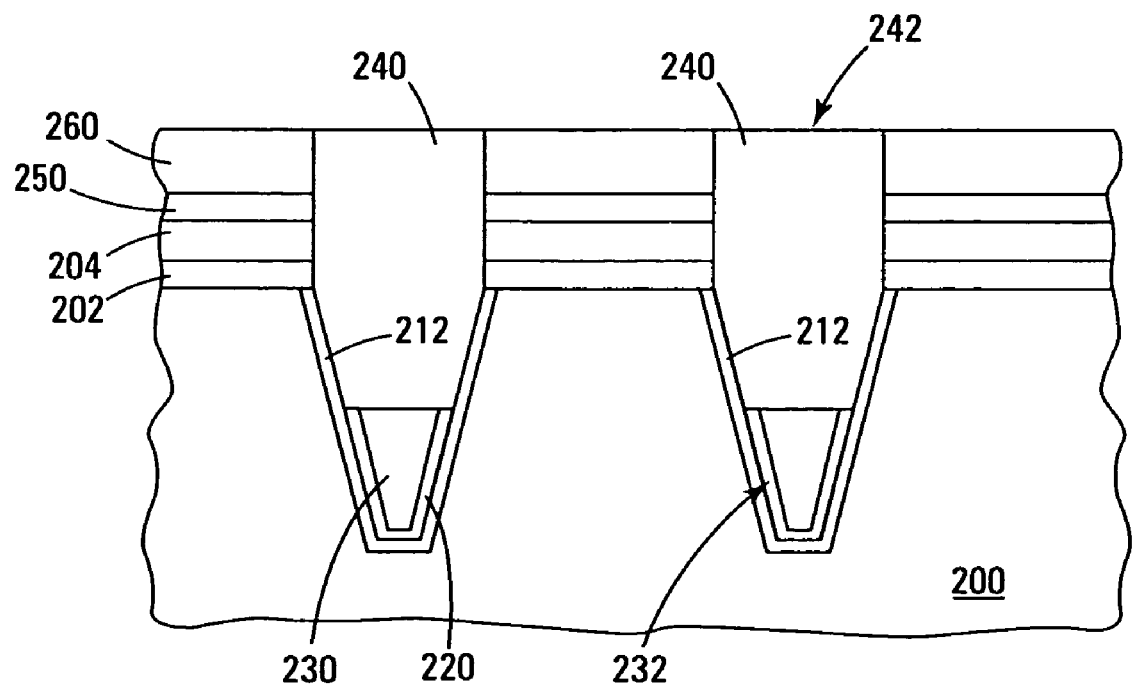

Mask 206 is subsequently removed to expose the conductive layer 204. An intergate dielectric layer 250, e.g., such as a layer of silicon oxide, a nitride, an oxynitride, an oxide-nitride-oxide (ONO) layer, etc., is then formed on the exposed conductive layer 204. A conductive layer 260, such as a doped polysilicon layer, a metal layer, e.g., refractory metal layer, a metal containing layer, e.g., a metal silicide layer, or the like, is formed on the intergate dielectric layer 250, as shown in FIG. 2H. The conductive layer 260 may include one or more conductive materials or conductive layers, a metal or metal containing layer disposed on a polysilicon layer, etc. For another embodiment, conductive layers 204 and 260 respectively form a floating gate and a control gate (or word line) of memory cells of a memory array, such as memory array 104 of FIG. 1. Source/drain regions are also formed in a portion of substrate 200 not shown in FIG. 2G as a part of the memory array. For one embodiment, conductive layer 204 is extended to improve the coupling of the floating gate. The trenches 210 filled with dielectric materials, as described above, act to prevent extraneous current flow through the substrate between the memory cells.

The components located in the region peripheral to memory array 104 of FIG. 1 are also formed on the substrate 200, and the trenches 210 filled with dielectric materials, as described above, may be formed between the region peripheral to memory array 104 and memory array 104 and act to prevent extraneous current flow through the substrate between components of the peripheral region and memory array 104.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming a portion of a memory device, comprising:

forming a first dielectric plug in a portion of a trench that extends into a substrate so that an upper surface of the first dielectric plug is recessed below an upper surface of the substrate, wherein the first dielectric plug comprises a layer of a spin-on dielectric material in contact with a nitride layer interposed between the substrate and the spin-on dielectric material, ends of the nitride layer recessed into the trench below the upper surface of the substrate to a level of an upper surface of the layer of a spin-on dielectric material, the ends of the nitride layer and the upper surface of the layer of a spin-on dielectric material forming the upper surface of the first dielectric plug; and forming a second dielectric plug on the upper surface of the first dielectric plug.

2. The method of claim 1, wherein forming the first dielectric plug further comprises forming the nitride layer on a dielectric liner that lines a portion of the trench and is disposed on the substrate.

3. The method of claim 2, wherein forming the second dielectric plug comprises forming a portion of the second dielectric plug on the dielectric liner.

4. The method of claim 1, wherein the second dielectric plug is a high-density-plasma oxide.

5. The method of claim 1, wherein forming the first dielectric plug further comprises curing the spin-on dielectric material.

6. The method of claim 5, wherein curing the spin-on dielectric material comprises an oxidation process.

7. A method of forming a portion of a memory device, comprising:

lining a portion of a trench that extends into a substrate with a first dielectric layer by forming the first dielectric layer in contact with the substrate;

forming a second dielectric layer in contact with the first dielectric layer;

forming a layer of spin-on dielectric material in contact with the second dielectric layer so that the layer of spin-on dielectric material fills a portion of the trench and so that an upper surface of the layer of spin-on dielectric material is located below an upper surface of the substrate;

removing a portion of the second dielectric layer to a level of the upper surface of the layer of spin-on dielectric material to expose a portion of the first dielectric layer located between the upper surface of the layer of spin-on dielectric material and the upper surface of the substrate; and forming a third dielectric layer within the trench so as to fill a remaining portion of the trench, wherein a portion of the third dielectric layer is formed on the upper surface of the layer spin-on dielectric material and on the exposed portion of the first dielectric layer.

8. The method of claim 7, wherein the trench passes through a fourth dielectric layer formed on the upper surface of the substrate and a conductive layer formed on the fourth dielectric layer.

9. The method of claim 7, wherein forming the layer of spin-on dielectric material further comprises annealing the layer of spin-on dielectric material.

10. A method of forming a portion of a memory device, comprising:

lining a portion of a trench that extends into a substrate with an oxide layer by forming the oxide layer in contact with exposed portions of the substrate;

forming a nitride layer in contact with the oxide layer;

forming a spin-on dielectric layer in contact with the nitride layer so that the spin-on dielectric layer fills a portion of the trench and so that an upper surface of the spin-on dielectric layer is located below an upper surface of the substrate;

removing a portion of the nitride layer to a level of the upper surface of the spin-on dielectric layer to expose a portion of the oxide layer located between the upper surface of the spin-on dielectric layer and the upper surface of the substrate; and forming a high-density-plasma oxide layer within the trench so as to fill a remaining portion of the trench, wherein a portion of the high-density-plasma oxide layer is formed on the upper surface of the spin-on dielectric layer and on the exposed portion of the oxide layer.

11. The method of claim 10, wherein the trench passes through a tunnel dielectric layer formed on the upper surface of the substrate and a polysilicon layer formed on the tunnel dielectric layer.

12. The method of claim 10, wherein forming the spin-on dielectric layer further comprises annealing the spin-on dielectric layer.

13. The method of claim 12, wherein annealing the spin-on dielectric layer comprises a steam-oxidation process.

14. A method of forming a portion of a memory device, comprising:

forming a trench through a conductive layer disposed on a first dielectric layer disposed on an upper surface of a substrate, the trench extending into the substrate below the upper surface the substrate to expose a portion of the substrate below the upper surface of the substrate;

lining the trench below the upper surface of the substrate with a second dielectric layer by forming the second dielectric layer on the exposed portion of the substrate below the upper surface of the substrate;

forming a third dielectric layer overlying portions of the conductive layer and the first dielectric layer through which the trench passes, and on the second dielectric layer;

forming a fourth dielectric layer on the third dielectric layer so that the fourth dielectric layer fills the trench to a level above the upper surface of the substrate;

removing a portion of the fourth dielectric layer so that an upper surface of the fourth dielectric layer is recessed below the upper surface of the substrate;

selectively removing a portion of the third dielectric layer to a level of the upper surface of the fourth dielectric layer to expose portions of the conductive layer and the first dielectric layer through which the trench passes and a portion of the second dielectric layer located between the upper surface of the fourth dielectric layer and the upper surface of the substrate; and forming a fifth dielectric layer on the exposed portions of the conductive layer and the first dielectric layer through which the trench passes, the exposed portion of the second dielectric layer, and on the upper surface of the of the fourth dielectric layer, wherein the fifth dielectric layer fills the trench above the upper surface of the of the fourth dielectric layer.

15. The method of claim 14, wherein forming the trench comprises patterning a mask layer disposed on the conductive layer and etching.

16. The method of claim 15, further comprising removing the fifth dielectric layer to expose an upper surface of the mask layer and so that an upper surface of the fifth dielectric layer within the trench is substantially flush with the upper surface of the mask layer.

17. The method of claim 16, wherein removing the fifth dielectric layer comprises chemical mechanical polishing.

18. The method of claim 14, wherein selectively removing a portion of the third dielectric layer is accomplished using wet etching.

19. The method of claim 14, wherein removing a portion of the fourth dielectric layer comprises an etch-back process.

20. The method of claim 14, wherein the fourth dielectric layer is a spin-on dielectric layer and the fifth dielectric layer is a high-density-plasma oxide layer.

21. A method of forming a portion of a memory device, comprising:
   forming a trench through a conductive layer disposed on a first dielectric layer disposed on an upper surface of a substrate, the trench extending into the substrate below the upper surface the substrate to expose a portion of the substrate below the upper surface of the substrate;
   lining the trench below the upper surface of the substrate with a second dielectric layer by forming the second dielectric layer on the exposed portion of the substrate below the upper surface of the substrate;
   forming a third dielectric layer overlying portions of the conductive layer and the first dielectric layer through which the trench passes, and on the second dielectric layer;
   forming a fourth dielectric layer on the third dielectric layer so that the fourth dielectric layer fills the trench to a level above the upper surface of the substrate;
   after curing the fourth dielectric layer, removing a portion of the fourth dielectric layer so that an upper surface of the fourth dielectric layer is recessed below the upper surface of the substrate;
   selectively removing a portion of the third dielectric layer to a level of the upper surface of the fourth dielectric layer to expose portions of the conductive layer and the first dielectric layer through which the trench passes and a portion of the second dielectric layer located between the upper surface of the fourth dielectric layer and the upper surface of the substrate; and
   forming a fifth dielectric layer on the exposed portions of the conductive layer and the first dielectric layer through which the trench passes, the exposed portion of the second dielectric layer, and on the upper surface of the of the fourth dielectric layer, wherein the fifth dielectric layer fills the trench above the upper surface of the of the fourth dielectric layer.

22. A method of forming a portion of a memory device, comprising:
   forming a tunnel dielectric layer, on an upper surface of a substrate;
   forming a conductive layer on the tunnel dielectric layer;
   forming a hard mask on the conductive layer;
   forming a trench through the hard mask, the conductive layer, and the tunnel dielectric layer and into the substrate to expose a portion of the substrate below the upper surface of the substrate;
   forming a stress-relieving and adhesion layer on the exposed portion of the substrate below the upper surface of the substrate;
   forming a barrier layer on the hard mask, on portions of the conductive layer and the tunnel dielectric layer through which the trench passes, and on the stress-relieving and adhesion layer;
   forming a layer of spin-on dielectric material on the barrier layer so that the layer of spin-on dielectric material fills the trench to a level above the upper surface of the substrate;
   annealing the layer of spin-on dielectric material;
   removing a portion of the annealed layer of spin-on dielectric material so that an upper surface of the annealed layer of spin-on dielectric material is recessed below the upper surface of the substrate;
   selectively removing a portion of the barrier layer to a level of the upper surface of the annealed layer of spin-on dielectric material to expose the hard mask, portions of the conductive layer and the tunnel dielectric layer through which the trench passes, and a portion of the stress-relieving and adhesion layer located between the upper surface of the annealed layer of spin-on dielectric material and the upper surface of the substrate;
   forming a layer of high-density-plasma dielectric material on the exposed hard mask, the exposed portions of the conductive layer and the tunnel dielectric layer through which the trench passes, the exposed portion of the stress-relieving and adhesion layer, and on the upper surface of the annealed layer of spin-on dielectric material, wherein the layer of high-density-plasma material fills the trench above the upper surface of the annealed layer of spin-on dielectric material; and
   removing the layer of high-density-plasma dielectric material to expose an upper surface of the hard mask and so that an upper surface of the layer of high-density-plasma dielectric material within the trench is substantially flush with the upper surface of the hard mask.

23. The method of claim 22, wherein the stress-relieving and adhesion layer facilitates adhering the barrier layer to the substrate and relieving stresses between the substrate and the barrier layer.

24. The method of claim 22, wherein annealing the layer of spin-on dielectric material comprises an oxidation process.

25. The method of claim 24, wherein the barrier layer acts to limit oxidation of the substrate during the oxidation process.

26. The method of claim 22, wherein the tunnel dielectric layer is a tunnel oxide.

27. The method of claim 22, wherein the high-density-plasma dielectric material is a high-density-plasma oxide.

28. The method of claim 22, wherein the barrier layer and the second dielectric layer are nitrides.

29. The method of claim 22, wherein the conductive layer is a polysilicon layer.

30. The method of claim 22, wherein removing the layer of high-density-plasma dielectric material comprises chemical mechanical polishing.

31. The method of claim 22, wherein forming the trench comprises patterning the hard mask and etching.

32. The method of claim 22, wherein selectively removing a portion of the barrier layer is accomplished using wet etching.

33. The method of claim 32, wherein removing a portion of the annealed layer of spin-on dielectric material comprises an etch-back process.

34. The method of claim 22, further comprising:
   removing the hard mask from the conductive layer;
   forming an intergate dielectric layer on the conductive layer; and forming another conductive layer on the intergate dielectric layer.

35. The method of claim 22, wherein forming a conductive layer on the tunnel dielectric layer further comprises extending the conductive layer.

36. A method of forming a portion of a memory device, comprising:
   forming a tunnel oxide layer on an upper surface of a substrate;
   forming a polysilicon layer on the tunnel oxide layer;
   forming a nitride mask layer on the polysilicon layer;
   patterning the nitride mask layer and etching to form a trench through the nitride mask layer, the polysilicon layer, tunnel oxide layer and into the substrate to expose a portion of the substrate below the upper surface of the substrate;
   forming a second oxide layer on the exposed portion of the substrate below the upper surface of the substrate;
   forming a second nitride layer on the nitride mask layer, on portions of the polysilicon layer and the tunnel oxide layer through which the trench passes, and on the second oxide layer;
   forming a layer of spin-on dielectric material on the second nitride layer so that the layer of spin-on dielectric material fills the trench to a level above the upper surface of the substrate;
   annealing the layer of spin-on dielectric material using a steam-oxidation process;
   etching away a portion of the annealed layer of spin-on dielectric material so that an upper surface of the annealed layer of spin-on dielectric material is recessed below the upper surface of the substrate;
   selectively etching away a portion of the second nitride layer to a level of the upper surface of the annealed layer of spin-on dielectric material to expose the nitride mask layer, portions of the poloysilicon layer and the tunnel oxide layer through which the trench passes, and a portion of the second oxide layer located between the upper surface of the annealed layer of spin-on dielectric material and the upper surface of the substrate;
   forming a layer of a high-density-plasma oxide on the exposed nitride mask layer, the exposed portions of the polysilicon layer and the tunnel oxide layer through which the trench passes, the exposed portion of the second oxide layer, and on the upper surface of the annealed layer of spin-on dielectric material, wherein layer of the high-density-plasma oxide fills the trench above the upper surface of the annealed layer of spin-on dielectric material; and
   removing the layer of the high-density-plasma oxide by chemical mechanical polishing to expose an upper surface of the nitride mask layer and so that an upper surface of the layer of the high-density-plasma dielectric oxide within the trench is substantially flush with the upper surface of the nitride mask layer.

37. The method of claim 36, further comprising:
   removing the nitride mask from the conductive layer;
   forming an intergate dielectric layer of the conductive layer; and
   forming another conductive layer on the intergate dielectric layer.

38. A method of forming a portion of an integrated circuit device contained on a semiconductor substrate, the method comprising:
   removing a portion of the substrate to define an isolation trench;
   forming a first dielectric layer on exposed surfaces of the substrate in the trench;
   forming a second dielectric layer on at least the first dielectric layer, wherein the second dielectric layer contains a different dielectric material than the first dielectric layer;
   forming a third dielectric layer in the trench covering a portion of the second dielectric layer;
   removing an exposed portion of the second dielectric layer from the trench, thereby exposing a portion of the first dielectric layer; and
   forming a fourth dielectric layer in the trench covering the exposed portion of the first dielectric layer.

39. The method of claim 38, wherein forming the first dielectric layer comprises forming a thermal oxide and wherein the semiconductor substrate is a silicon-containing substrate.

40. The method of claim 38, wherein forming the second dielectric layer comprises depositing a layer of silicon nitride.

41. The method of claim 38, wherein forming the third dielectric layer comprises depositing a layer of spin-on dielectric.

42. A method of forming a portion of an integrated circuit device contained on a semiconductor substrate, the method comprising:
   removing a portion of the substrate to define an isolation trench;
   forming a first dielectric layer on exposed surfaces of the substrate in the trench;
   forming a second dielectric layer on at least the first dielectric layer, wherein the second dielectric layer contains a different dielectric material than the first dielectric layer;
   depositing a spin-on dielectric to fill the trench;
   curing the spin-on dielectric;
   after curing the spin-on dielectric, removing an upper portion of the cured spin-on dielectric from the trench, leaving a lower portion of the cured spin-on dielectric covering a portion of the second dielectric layer;
   removing an exposed portion of the second dielectric layer from the trench, thereby exposing a portion of the first dielectric layer; and
   forming a fourth dielectric layer in the trench covering the exposed portion of the first dielectric layer.

43. The method of claim 42, wherein removing the upper portion of the cured spin-on dielectric from the trench comprises etching.

44. The method of claim 42, wherein curing the spin-on dielectric comprises an oxidizing process.

45. The method of claim 44, wherein the second dielectric layer is chosen to protect the substrate from the oxidizing process.

46. The method of claim 45, wherein the second dielectric layer is a silicon nitride layer.

47. A method of forming a portion of a floating-gate memory device, comprising:
   forming a first dielectric layer as a tunnel dielectric layer on a semiconductor substrate;
   forming a first conductive layer as a floating-gate layer on the first dielectric layer;
   patterning the first dielectric layer and first conductive layer to define at least one isolation region;
   removing a portion of the substrate to define a trench in the at least one isolation region;
   forming a second dielectric layer on exposed surfaces of the substrate in the trench;

forming a third dielectric layer on at least the second dielectric layer, wherein the third dielectric layer contains a different dielectric material than the second dielectric layer;

forming a fourth dielectric layer in the trench covering a portion of the third dielectric layer;

removing an exposed portion of the third dielectric layer from the trench, thereby exposing a portion of the second dielectric layer;

forming a fifth dielectric layer in the trench covering the exposed portion of the second dielectric layer;

forming a sixth dielectric layer as an intergate dielectric layer overlying the first conductive layer;

forming a second conductive layer as a control gate layer overlying the sixth dielectric layer; and patterning the first dielectric layer, the first conductive layer, the sixth dielectric layer and the second conductive layer to define at least one floating-gate memory cell.

48. The method of claim 47, further comprising:

forming a hard mask overlying the first conductive layer before patterning the first dielectric layer and first conductive layer; and removing the hard mask before forming the sixth dielectric layer overlying the first conductive layer.

49. The method of claim 47, wherein forming the fourth dielectric layer comprises depositing a layer of spin-on dielectric.

50. The method of claim 47, wherein the second conductive layer comprises one or more conductive layers.

51. The method of claim 50, wherein the one or more conductive layers of the second conductive layer comprise at least one of a polysilicon layer and a metal containing layer.

52. The method of claim 47, wherein forming a first conductive layer as a floating-gate layer further comprises extending the floating-gate layer.

53. The method of claim 47, wherein the sixth dielectric layer comprises one or more dielectric layers.

54. A method of forming a portion of a floating-gate memory device, comprising:

forming a first dielectric layer as a tunnel dielectric layer on a semiconductor substrate;

forming a first conductive layer as a floating-gate layer on the first dielectric layer;

patterning the first dielectric layer and first conductive layer to define at least one isolation region;

removing a portion of the substrate to define a trench in the at least one isolation region;

forming a second dielectric layer on exposed surfaces of the substrate in the trench;

forming a third dielectric layer on at least the second dielectric layer, wherein the third dielectric layer contains a different dielectric material than the second dielectric layer;

forming a fourth dielectric layer in the trench covering a portion of the third dielectric layer;

depositing a spin-on dielectric to fill the trench curing the spin-on dielectric;

after curing the spin-on dielectric, removing an upper portion of the cured spin-on dielectric from the trench, leaving a lower portion of the cured spin-on dielectric covering the portion of the second dielectric layer;

removing an exposed portion of the third dielectric layer from the trench, thereby exposing a portion of the second dielectric layer;

forming a fifth dielectric layer in the trench covering the exposed portion of the second dielectric layer;

forming a sixth dielectric layer as an intergate dielectric layer overlying the first conductive layer;

forming a second conductive layer as a control gate layer overlying the sixth dielectric layer; and patterning the first dielectric layer, the first conductive layer, the sixth dielectric layer and the second conductive layer to define at least one floating-gate memory cell.

\* \* \* \* \*

UNITED STATES PATENT AND TRADEMARK OFFICE
CERTIFICATE OF CORRECTION

PATENT NO. : 7,332,408 B2  
APPLICATION NO. : 10/878805  
DATED : February 19, 2008  
INVENTOR(S) : Violette Page 1 of 1

It is certified that error appears in the above-identified patent and that said Letters Patent is hereby corrected as shown below:

In column 8, line 60, in Claim 14, before "fourth" delete "of the".

In column 8, line 62, in Claim 14, before "fourth" delete "of the".

In column 9, line 32, in Claim 21, after "substrate," insert -- curing the fourth dielectric layer; --.

In column 9, line 48, in Claim 21, before "fourth" delete "of the".

In column 9, line 50, in Claim 21, before "fourth" delete "of the".

In column 11, line 37, in Claim 36, delete "poloysilicon" and insert -- polysilicon --, therefor.

Signed and Sealed this

Eighteenth Day of August, 2009

David J. Kappos
*Director of the United States Patent and Trademark Office*